United States Patent [19]

Van Broekhoven et al.

[11] Patent Number: 4,890,055

[45] Date of Patent: Dec. 26, 1989

[54] COMPENSATED CHIRP FOURIER TRANSFORMER

[75] Inventors: Paul Van Broekhoven, Needham; Walter J. Guinon, Newburyport, both of Mass.

[73] Assignee: The Charles Stark Draper Laboratory, Inc., Cambridge, Mass.

[21] Appl. No.: 264,447

[22] Filed: Oct. 28, 1988

[51] Int. Cl.[4] .............................................. G01R 23/16

[52] U.S. Cl. ................................ 324/77 B; 324/77 R

[58] Field of Search .................. 324/77 R, 77 B, 77 J, 324/77 H, 77 D, 78 D; 364/821, 827, 826

[56] References Cited

U.S. PATENT DOCUMENTS

| | | | |
|---|---|---|---|
| 4,049,958 | 9/1977 | Hartmann | 364/821 |
| 4,070,638 | 1/1978 | Reeder | 364/821 |
| 4,284,351 | 8/1981 | Alldritt et al. | 324/77 J |
| 4,716,362 | 12/1987 | Ambos et al. | 324/77 B |

*Primary Examiner*—John Chapman
*Assistant Examiner*—Louis M. Arana
*Attorney, Agent, or Firm*—Lahive & Cockfield

[57] ABSTRACT

A method and circuit for compensating a chirp Fourier transformer wherein alignment tones of known frequency are provided in the input signal, and the transforms of the alignment tones in the output signal are measured. The output signal is converted to baseband and digitized at intervals defined by a clock signal which is generated at a rate proportional to the spacing of the transformed alignment tones. As the temperature varies, displacement of the transformed alignment tones is detected and the clock is slued such that each sample of the baseband-converted output corresponds to a fixed bandwidth segment of the input signal. In one construction, an identical SAW element generates a delayed replica which is used as a baseband conversion reference to convert the output to baseband. In a preferred embodiment, all reference frequencies are synthesized from a common clock synchronized to the input frame, and phase and frequency compensating loops adjust the output sampling clock and the baseband conversion reference waveform.

18 Claims, 7 Drawing Sheets

COMPENSATED CHIRP FOURIER TRANSFORMER

This invention relates to chirp Fourier transforming circuitry of the type which employs one or more analog circuit elements to transform an input signal into an output signal representative of the frequency domain Fourier transform of the input signal. More particularly, it relates to such devices which employ a surface acoustic wave (SAW) device having a surface pattern formed of a piezoelectric material, such as lithium niobate. The frequency-dependent dispersive or compressive effects on an acoustic wave input signal propagated in such circuit elements are used to provide and mix "chirped" signals for obtaining an output signal representative of the Fourier transform.

The input signal to such a device has a bandwidth B about a first nominal center frequency and is processed in discrete segments of duration T to transform the information in a time bandwidth block or "frame" of dimensions T×B. The output is provided as modulation of a carrier at a second nominal center frequency, which depends on the characteristics of the SAW device employed. Because the basic signal transformations involve the propagation of an acoustic wave along a physical surface structure having dimensions and characteristics which vary with temperature, the output signal varies with the device temperature. SAW devices of the prior art are therefore operated in an oven to stabilize their temperature, so that a given output signal component is representative of a fixed input frequency band. Ovenizing the SAW devices has imposed size, power and cost penalties which restrict the range of applications of this signal processing technology.

OBJECTS AND SUMMARY OF THE INVENTION

It is an object of the invention to provide an accurate non-ovenized chirp transformer circuit.

It is another object of the invention to provide a SAW chirp transformer with means for correcting temperature-induced variations of its output signal.

It is another object of the invention to provide a SAW chirp transformer having a digitally-sampled output, wherein a feedback loop adjusts the sampling circuitry to maintain a fixed correspondence between portions of the sampled output signal and components of the input signal band.

These and other features are obtained in a preferred embodiment of the invention by a circuit wherein alignment tones of known frequency are provided in the input signal, and the transforms of the alignment tones in the output signal are measured, with the measurement used to normalize the output. A first measurement is used to correct temperature induced scale variations of the output band and a second measurement is used to correct timing changes of the output signal. In a prototype embodiment, the output signal is converted to baseband and digitized at intervals defined by a clock signal. The clock signal is generated at a rate proportional to the spacing of the transformed alignment tones, such that each sample of the baseband-converted output signal corresponds to a fixed bandwidth segment of the input signal. Measurements on the transformed alignment tones are used to vary the phase of a reference baseband conversion signal, compensating for phase variation of the output. In a preferred embodiment, all reference frequencies are synthesized from a common clock synchronized to the input frame, and phase and frequency compensating loops adjust the output sampling clock and baseband conversion reference waveform. In another embodiment, the baseband conversion reference waveform is generated by a parallel set of matched SAW elements.

These and other features will be understood from the following drawings and detailed description thereof, taken together with the claims, when considered in light of the background art and skills of a worker in the field.

DETAILED DESCRIPTION OF THE DRAWINGS

Figure 1:
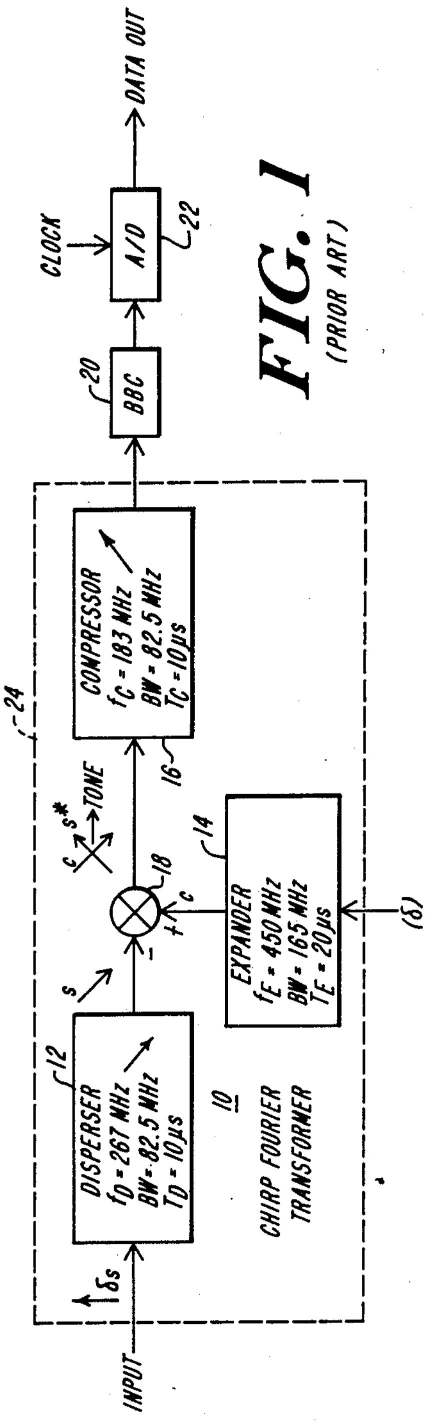
FIG. 1 (PRIOR ART)
FIG. 1 shows a block diagram of a representative SAW chirp transformer of the prior art.

FIG. 1 shows a representative chirp Fourier transforming circuit 10 of the prior art, which operates on successive "frames" or T-second segments of an input signal s having a range of frequency components to produce a transformed output signal which appears as modulation of a nominal center frequency. The illustrated chirp transformer includes a first disperser SAW element 12 which delays components of the input signal in a frequency-dependent manner, a second expander SAW element 14 which produces a chirped local oscillator signal in response to an impulse, and a mixer 18 which mixes the chirped input and local oscillator signals. The mixed signal is compressed by a third SAW element 16 to produce the output signal. Illustratively, the chirp-transform information of the output signal is extracted by converting the output to baseband with a converter 20, with the resultant signal sampled in successive intervals by an A/D converter 22 to develop output data wherein the amplitude of a sampled output signal in each time interval corresponds to the power of the input signal in a corresponding portion of the input frequency band. The SAW components are maintained in an oven 24.

Figure 2A:
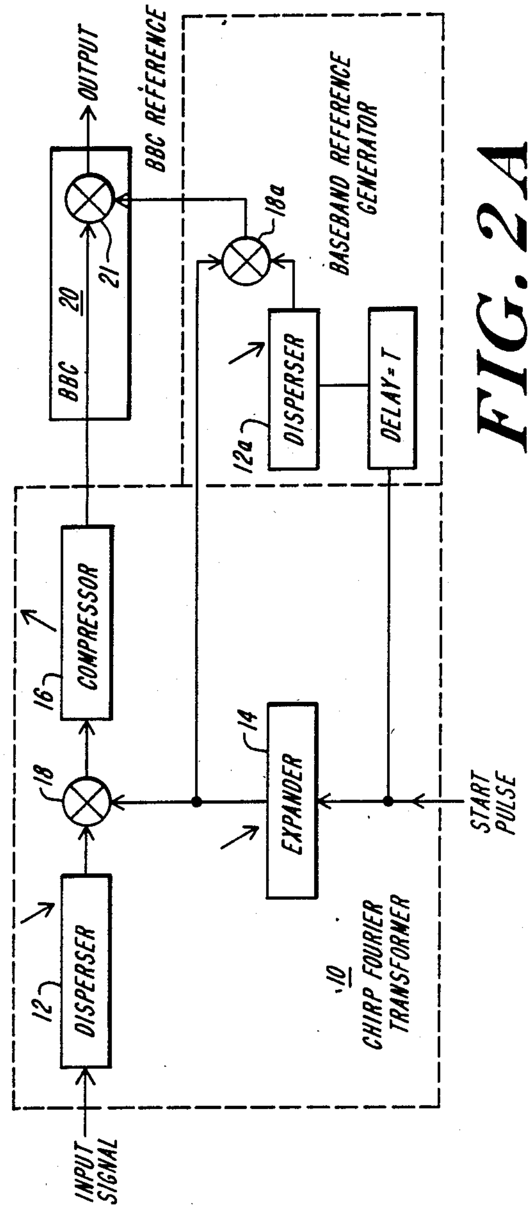
FIG. 2A is a diagram of a circuit for generating a block reference waveform in a first embodiment of the invention.

FIG. 2A illustrates a detail of a temperature compensated chirp transformer according to a first embodiment of the present invention. Components corresponding to those of FIG. 1 are labelled identically in order to more clearly indicate the improvements over the prior art. According to this construction, alignment tones are mixed with input signal and transformed by the CFT circuitry, as discussed in greater detail hereafter; and measurements are then made upon the transformed alignment tones to detect changes in parameters of the SAW devices. As shown in FIG. 2A, the measurements are used to correct the chirp transformer errors by providing a substantially compensated baseband conversion block reference waveform to demodulate the transformer output.

As shown in FIG. 2A, the circuit for generating a reference frequency having suitable block phase characteristics for the baseband conversion of a "frame" or transform of a T-microsecond segment of the input signal includes a set of substantially identical SAW elements which are operated in synchrony with the CFT transformer to produce a delayed replica of the transformed carrier signal. Basically, the transformer output "carrier frequency" is the output frequency which obtains when an impulse arrives at the trailing edge of the input frame. To generate a block BBC reference at this frequency, the start pulse to the expander 14 is delayed one frame and applied to a second disperser 12*a* identical to the disperser 12 in the signal path. The second disperser output is mixed with the expander pulse by a mixer 18*a* having characteristics identical to mixer 18, to produce a tone burst at a frequency $\omega_x-\omega_d-B/2$, where $\omega_d$ and $\omega_x$ are the disperser and expander center frequencies, respectively and B/2 is the input frame bandwidth. This waveform is properly time aligned with the transform output data which commences at the end of the input window. Moreover, this signal has the block phase characteristics necessary for baseband conversion. When it is mixed in a difference mixer 21 with the output of the compressor, frequencies at the low-band edge of the compressor output are mixed to zero frequency and frequencies at the high band edge appear at a frequency of B.

Thus, it will be appreciated that references to a baseband reference frequency herein mean a reference chirp signal having suitable timing alignment.

Figure 2B:
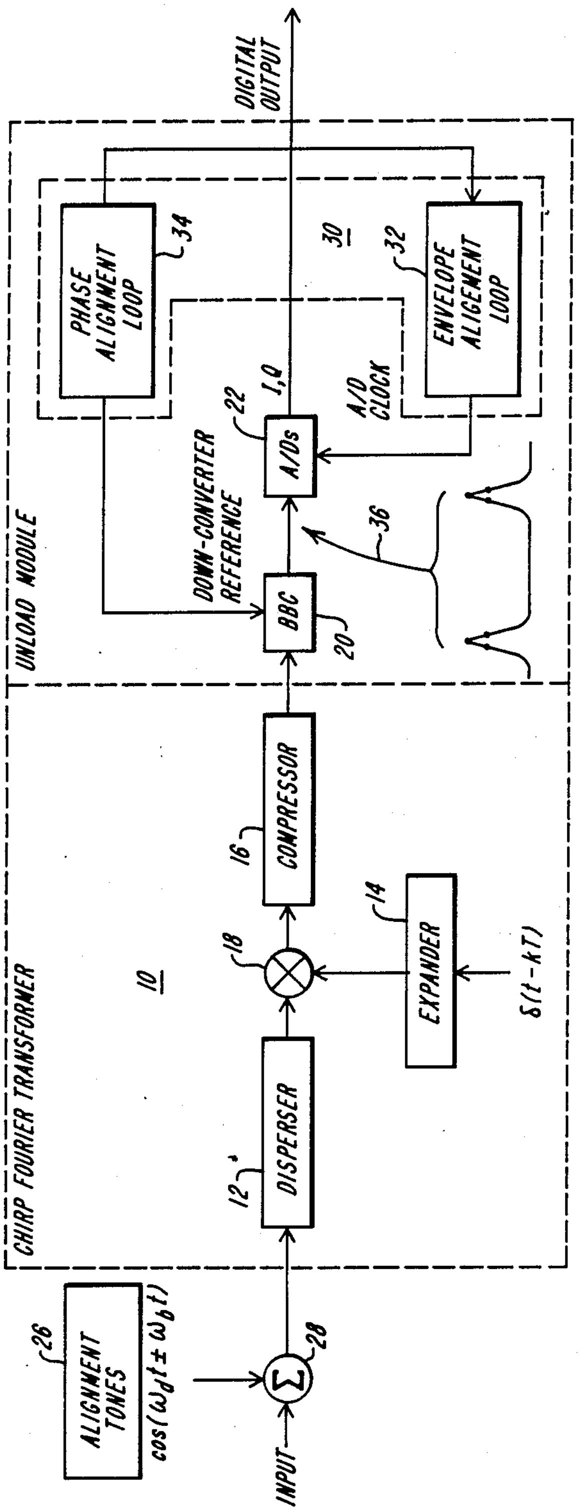
FIG. 2B shows a diagram corresponding to FIG. 1 of a temperature compensated chirp transformer according to a second embodiment the present invention.

FIG. 2B shows a block diagram of a second embodiment of a chirp transforming circuit according to the present invention. For convenience of prototype fabrication and optimization of noise characteristics, a convolve-multiply-convolve transformer (CMC) circuit configuration rather than the more common multiply-convolve-multiply (MCM) configuration was chosen.

Chirp transforming section 10 comprises SAW-type disperser, expander and compressor elements 12, 14, 16 and a mixer 18 of conventional type. In accordance with the invention, however, an alignment tone generator 26 provides alignment tones of known frequency which are summed with the input signal by a combiner 28. At the output end, a signal unloading module 30 measures the transforms of the alignment tones and alters the output signal processing to correct for scale and timing variations detected in the output signal. Specifically, an envelope alignment processor 32 detects changes in the time interval between the transformed alignment tones, and introduces a proportionate scale factor into the A/D sampling clock interval, and a phase processor 34 detects variations in the time-of-arrival of the transformed input signal and corrects the phase of a baseband conversion reference signal provided to the baseband converter 20 for down conversion of the chirp transformed output signal. The form of the transformed alignment tones is shown schematically at 36.

Figure 3:
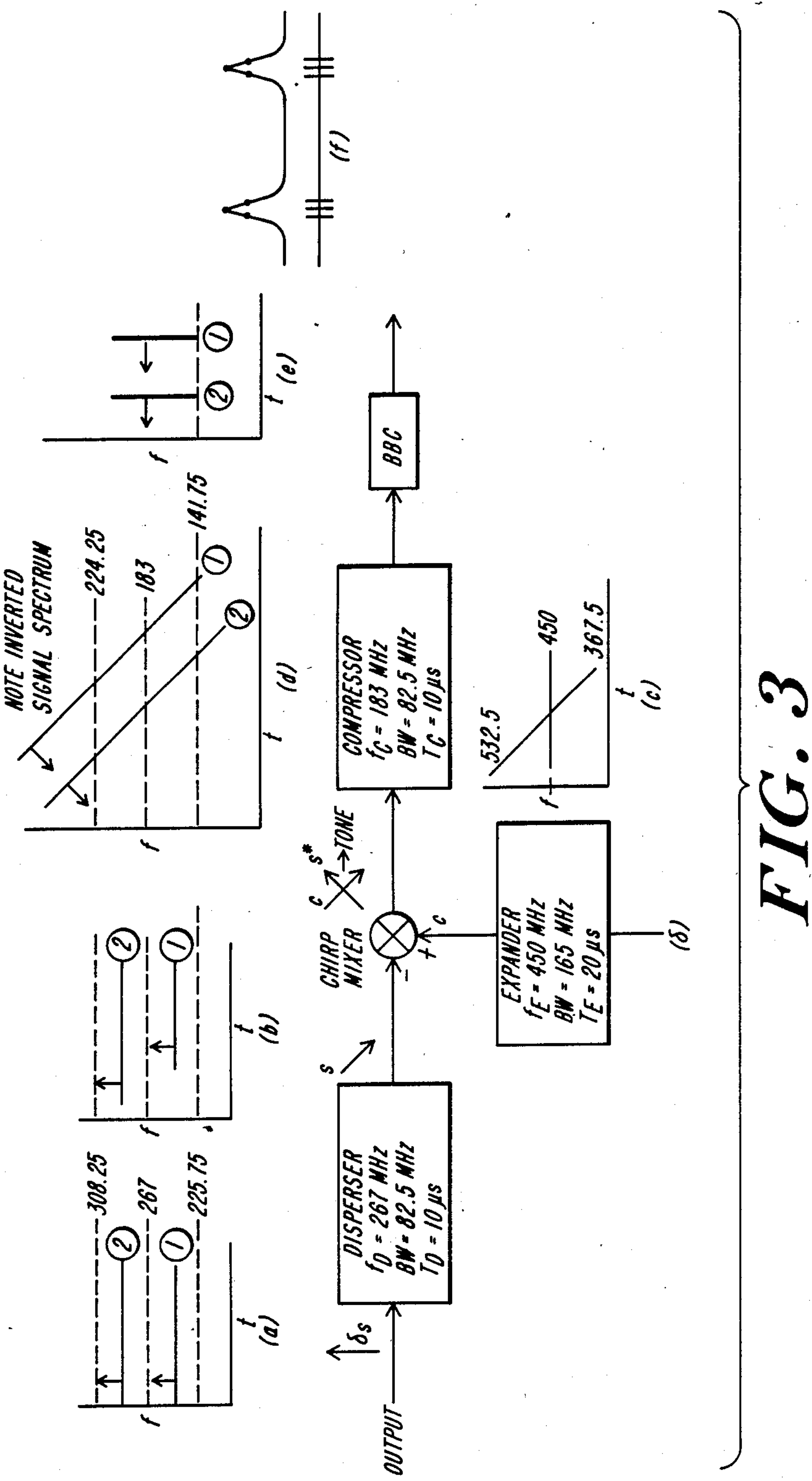
FIG. 3 illustrates representative signals transformed in the circuits of FIGS. 1 and 2.

FIG. 3 shows frequency-time graphs of signals transformed by a representative chirp transformer, and specifies the center frequency and bandwidth of each SAW element selected for a prototype embodiment of the present invention. Illustratively, first and second alignment tones at 267±40 MHz are injected at the lower and upper ends of the input signal band, and first and second corresponding transformed signals denoted (2) and (1) in the transformed signed diagrams are measured in corresponding time intervals after baseband conversion. The signals (1) and (2) correspond to those illustrated at 36 in FIG. 2B.

As shown in FIG. 3, the frequency components of a ten microsecond segment $\delta s$ of the input signal, shown in signal diagram (a), are dispersed so that the higher frequency components are slightly delayed, as in diagram (b) An impulse $\delta$ synchronized with the input segment is provided to the expander SAW device to produce a twenty microsecond down chirp, shown in diagram (c), which is mixed with the input chirp to produce chirped tones, diagrammed in (d). These tones are compressed by the compressor to produce a resolved signal wherein different input frequency components have each been transformed into separate time intervals of the output modulated carrier signal, as shown in diagram (e). When down converted with a suitable reference signal and sampled at an approximately 82.5 MHz clock frequency to define 825 sampling intervals for each ten microsecond input segment, the transformed input tones appear as peaks (1), (2) near the extremes of the transformed output signal interval.

Figure 4:
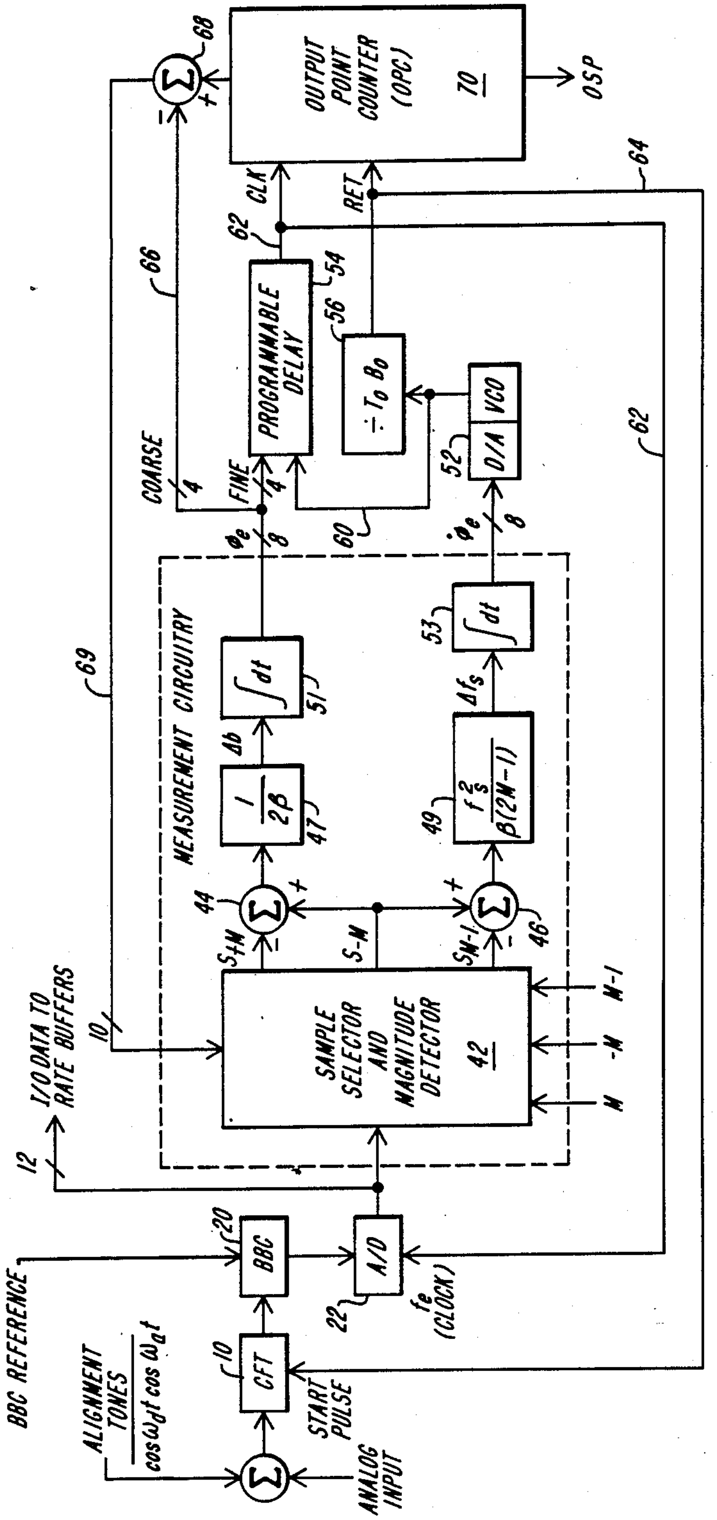
FIG. 4 illustrates the first embodiment of a temperature compensating CFT according to the invention in greater detail.

FIG. 4 shows another diagram of the embodiment of the invention shown in FIG. 2A, illustrating in more detail the output correction. The output of digital-to-analog converter 22 passes as a sequence of values $\{S_m\}$ to a measurement circuit 40 which measures and accumulates selected samples. Its measurements are used to vary the sampling clock. The sample selector selects specific samples in the output frame to develop a scaled clock signal which maintains the output transforms of the upper and lower frequency alignment tones centered in fixed sample intervals, the $M^{th}$ and the $-M^{th}$ sample intervals, respectively, on each side of a nominal central interval. Specifically, sample selector 42 provides samples to adders 44, 46 to form the difference quantities $S_{-M}-S_M$ and $S_{-M}-S_{M-1}$, where the quantities $S_{-M}$, $S_{-M+1}$ and $S_{M-1}$, $S_M$ are the output sample at points surrounding the lower and upper transformed alignment tones.

In a preferred control scheme, these points are maintained centered about the respective transformed tones, from which it follows that the first difference is $2\beta$ times the thermally induced output frame timing shift, or bias, $\Delta b$, and the second difference is $\beta(2M-1)/T_o$ times the induced frequency scale shift $\Delta f_s$, where $\beta$ is the slope of the transformed alignment tone at the sampling points, and $T_o$ is the input frame duration. SAW devices of this type are fabricated as substantially linear devices, so the value of $\beta$ at $S_{-M}$ is the negative of the signal slope at $S_M$.

The above difference quantities $S_{-M}-S_M$ and $S_{-M}-S_{M-1}$ are normalized in respective circuits 47, 49 which divide by the computed bias and scale constants to obtain a word representative of the change in bias or frequency scale, respectively; the normalized signals are integrated by summing elements 51, 53 to produce eight bit phase $\Phi_e$ and frequency $\dot{\Phi}_e$ envelope control words. The envelope frequency control word $\dot{\Phi}_e$ controls a VCO oscillator 52 to provide a frequency signal with a period proportional to the increased output scale. This VCO oscillator signal passes on line 60 to a programmable delay element 54. Delay element 54 is controlled by the least significant bits of the envelope phase control word $\Phi_e$ to delay the signal on line 60 by a fractional sample interval, and passes the phase delayed signal as a clock signal on line 62 to both the A/D sampler 22 and to an output point counter 70. In the illustrated embodiment, output point counter 70 is a 10 bit counter, used to count off 825 sampling points in the output signal for each ten microsecond input frame. Continuous-wave (CW) alignment tones spaced ±40 MHz from the nominal input center band are combined with the input signal to define narrow output transform signals which are maintained centered in particular sampling intervals—e.g., the first and the eight hundred twenty-fifth intervals as described above. These CW tones are used for fine adjustment of the bias.

The oscillator signal on line 60 is also divided down in divider 56 by $T_oB_o$, the input frame time-bandwidth product, illustratively 825, to provide a reset signal on line 64 to the output point counter 70; the reset signal is also provided as a start pulse to the chirp Fourier transformer to start the next frame, and to the baseband reference generator, FIG. 2A.

This maintains the output signal sampling intervals and the timing aligned such that a fixed sample bin of the 825 sample points within a transformed frame corresponds to a fixed 100 kHz frequency band of the input signal, so long as temperature-induced output shifts of the CFT are relatively small or slowly changing. The invention further contemplates correction of larger shifts by operation in a coarse alignment mode wherein pulsed alignment tones, rather than CW tones, are mixed with the input signal to provide broader alignment transforms in the output signal. In that case, the more significant bits of the envelope phase control word are passed along line 66 to an adder 68 which adds them to the output point counter output to develop a shifted output point count on line 69. This shifted output point count controls the sample selector 42, thus shifting the envelope by multiples of the basic sampling interval and maintaining the fixed sample intervals on the transformed alignment tones.

Figure 5:
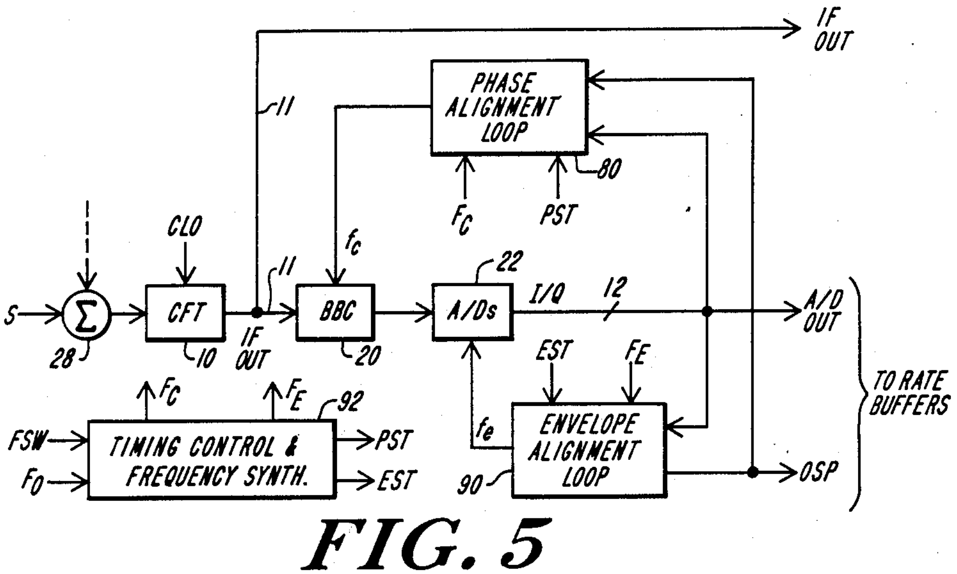
FIG. 5 is a diagram of the second embodiment of the invention.

A second embodiment of the invention is illustrated in FIG. 5. This embodiment differs from the embodiment of FIG. 4 in that a system time reference is used to define the chirp transformer input frame timing and center frequencies, while the transformer output floats in terms of time and frequency. Phase and envelope alignment loops then adjust the frequency and phase of the baseband conversion reference waveform and of the A/D clock to render the output digital transform data accurate. This construction allows sharing of the chirp transformer expanders among different channels, and operation of different channels with asynchronous frame rates. For this reason the chirp Fourier transformer 10 is indicated as receiving a chirped local oscillator signal CLO from a separate or outside expander unit, which may provide chirp signals to several different CFT "channels". Thus in FIG. 5, CFT 10 may be such a disperser-mixer-compressor unit, and need not include an expander as illustrated in the embodiment of FIGS. 2A, 4.

As illustrated in FIG. 5, an input signal s, which may be a standard analog input, or may be the output of an impulse generator when the transformer circuit is to be used for FFH synthesis, is provided to combiner 28, where alignment tones may or may not be coupled into the input bandwidth. The input signal then proceeds to the CFT channel module 10 where a product of the signal path by the chirped local oscillator, corresponding to expander 14 in FIG. 1, takes place. The raw CFT channel output is brought out on line 11 as IF OUT and also passes to the baseband converter 20. BBC 20 receives a reference frequency $f_c$ of approximately 184 MHz which is generated by a phase alignment loop 80, and converts the CFT channel output to baseband. The A/D converter 22 is clocked by a frequency $f_e$ of approximately 82.5 MHz provided by an envelope alignment loop 90, to digitize the signal. The digitized output digital data passes to rate buffers as well as to the alignment loops. A timing and synthesis module 92 generates reference frequencies and timing control command words which are used by the envelope and phase alignment loops.

Figure 6:
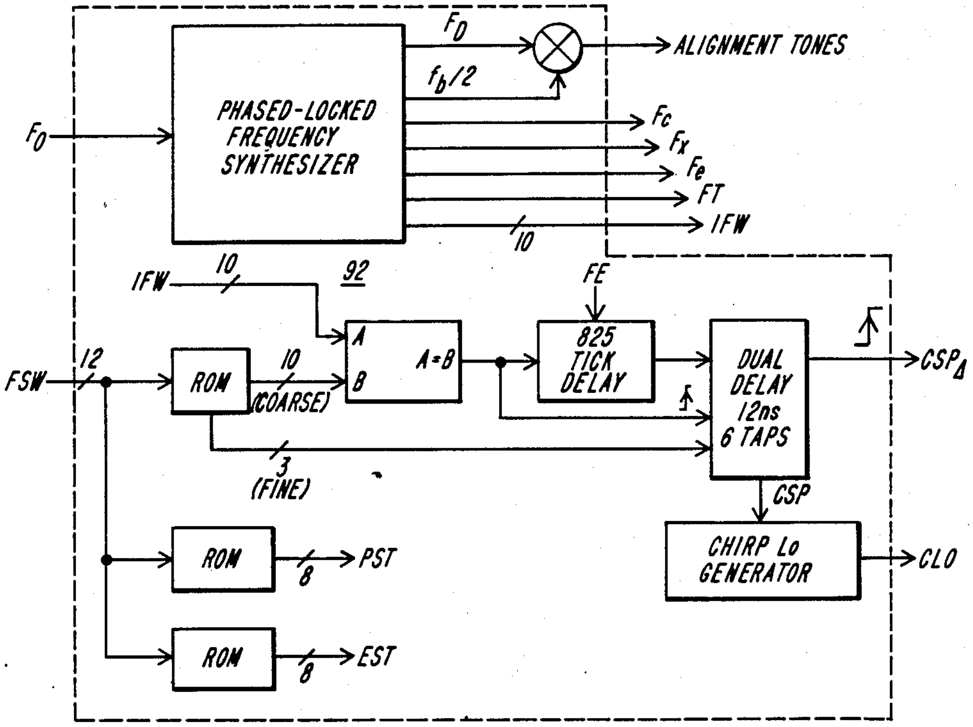
FIG. 6 shows the timing control and frequency synthesis of the embodiment of FIG. 5.

FIG. 6 illustrates the timing and frequency synthesis module 92 in greater detail. Frequency synthesizer and timing generator 92 receives a system clock signal $F_O$, typically a 5, 10 or 10.23 MHz signal, and synthesizes a nominal 82.5 MHz reference frequency $F_E$ from which the envelope alignment loop 90 develops the A/D clock signal $f_e$, and a nominal 184 MHz reference frequency $F_C$ corresponding to the CFT disperser center frequency, from which the phase alignment loop 80 develops the BBC reference $f_c$. It also synthesizes the other nominal disperser center frequency $F_D$ of 266 MHz, the expander center frequency of 450 MHz, and the half-width of the alignment tone spacing, denoted $f_b/2$, or approximately 40 MHz, all of which are applied to the CFT 10.

Given all of these frequencies, the frequency $f_b/2$ is mixed with $F_D$ to form the input alignment tones. The frequency $F_E$ is divided by 825 to form a 100 kHz input frame timing reference FT and a corresponding 10-bit input frame word (IFW). The frequency synthesis circuitry employs as little multiplication as possible, and all frequencies are phase-locked to the 100 kHz input frame timing reference FT.

In addition to the frequency synthesis, certain digital timing signals are developed as follows. A 12-bit frame start word FSW defines the trigger time of the CFT 10 within the ten-microsecond input frame; the 12-bit precision defines a±1.25 nanosecond timing accuracy.

The 12-bit FSW is input to a ROM, where it is separated into coarse and fine words of 10 and 3 bits, respectively. The coarse word is the number of full cycles of the 82.5-MHz clock that FSW represents. This is used to compare against IFW and to develop a leading edge to represent the CFT expander trigger time. The fine portion of FSW is used to delay this edge through a delay line. the signal which results is termed the CFT start pulse (CSP) and is used to trigger the CFT expanders in the chirp LO generator. The coarse CSP signal (before the delay line) is also delayed by one frame in an 825-tick delay, passes through the same delay line as the nondelayed CSP and then is routed to the envelope and phase loops as $CSP_\Delta$, as described below, where it initiates the output block reference. Finally, the control words PST and EST are generated from FSW to compensate the envelope and phase loops for the phase differences in their up-converted reference signals $F_c$ and $F_E$. PST and EST are 8-bit words representing the fractional part of the quantities (FSW/4096) (1840) and (FSW/4096)(825).

It will be appreciated that the timing and frequency synthesis module 92 generates reference frequencies and timing control signals, and as such it may simultaneously operate with a plurality of separate CFT transformers each of which processes a separate channel or signal.

As appears from the foregoing discussion, this second embodiment of the invention operates with a number of fixed parameters with respect to which the various temperature-induced CFT changes are resolved.

The system reference time (δ10 MHz) is used to synthesize an 82.5-MHz reference width is then divided by 825 to yield the input frame timing. Input frame bandwidth LO, CENTER and HI tones are defined as 224.75 MHz, 266 MHz and 307.25 MHz, which are the nominal disperser center frequency plus and minus the nominal CFT coverage or half-bandwidth. All of these CFT input parameters are thus controlled by the frequency synthesis and will not change as a result of CFT parameter variations. Similarly, output frame START, CENTER and STOP times are defined as the peaks of the CFT output response to the CFT input tones at 224.75 MHz, 266 MHz and 307.25 MHz, respectively.

As described more fully below, the CFT envelope alignment loop then controls the A/D converter clock such that 825 samples of the output frame are taken between the START and STOP output pulses, and such that output samples 1, 413 and 825 are taken at the respective peaks of the responses to the LO, CENTER and HI input tones. The absolute time at which these samples are taken floats as the CFT filter parameters change. Similarly, output frame LO, CENTER and HI frequencies are defined as the ticks 1, 413 and 825, respectively.

In this embodiment, output correction is then achieved as follows. The CFT phase alignment loop provides a BBC reference frequency such that an input impulse at tick 413 produces zero output frequency. The output phase is not important as long as it is stable, which is true if the circuitry used to generate the input alignment signals is phase stable. The alignment of the transformer to both the input frame-center impulse and scale factor in the envelope loop results in a substantially corrected response to impulses anywhere within the input frame band.

Figure 7:
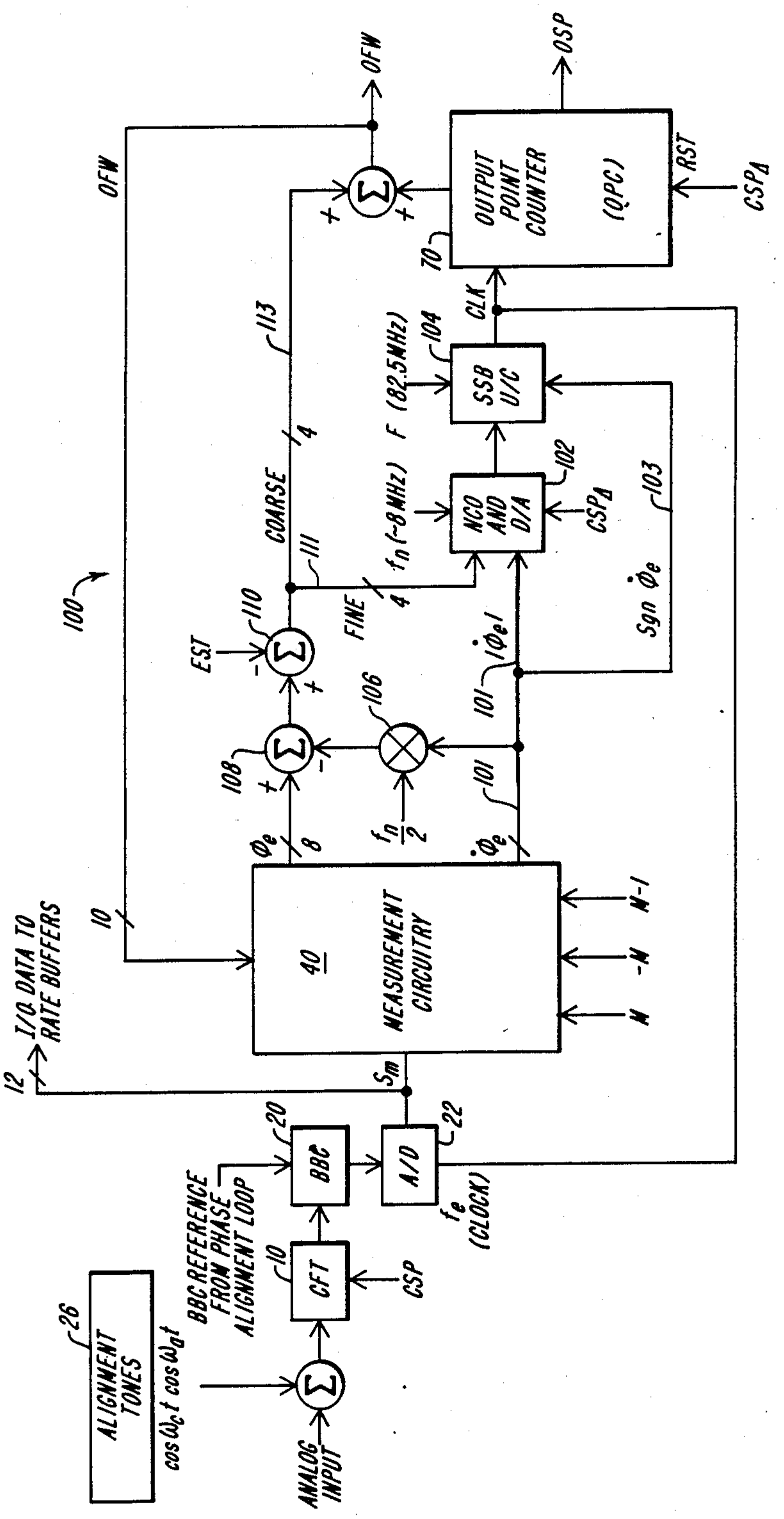
FIGS. 7 and 8 show output envelope and phase alignment loops, respectively, of the embodiment of FIG. 5.

FIG. 7 shows the envelope alignment circuitry 100 of this embodiment in greater detail. Its operation is best understood by comparison with the loop of FIG. 4. For the sake of clarity, the CFT, BBC and A/D blocks are shown in FIG. 7, even though they are not part of the envelope alignment loop and appear elsewhere in the other figures. The only difference in this region of FIG. 7 as compared to FIG. 4 is that the CFT start pulse (CSP) is generated from system time rather than internally generated. Otherwise, the analog input is transformed, digitized, and passes through the same measurement circuitry 40 as in FIG. 4.

At the output of the measurement circuitry 40, the frequency command $\dot{\Phi}_e$ is separated into its magnitude, $|\dot{\Phi}_e|$, and sign, SGN $\dot{\Phi}_e$. The magnitude passes on line 101 to an NCO 102 whose output is a triangle wave which is then single-sideband up-converted (SSB/UC) by frequency converter 104 using the 82.5-MHz (FE) nominal center frequency of the A/D clock. The signal SGN $\dot{\Phi}_e$ passes on line 103 to converter 104 and is used to modulate the final summation in the SSB/UC to achieve bipolar operation. The signal path for the measurement circuit frequency output to the A/D clock is thus much the same as that of FIG. 4, except that the D/A of this figure as been moved post-VCO, and the VCO of FIG. 4 is replaced by an NCO. Since the NCO input/output waveforms are repeatable, this results in exact retrace of A/D (and BBC) reference waveforms. Further, since NCOs can be instantaneously reset, the circuit may be shared or used for even/odd frame multiplexing. The absence of any filters in the up-converting path preserves this capability. This enables asynchronous CFT operation and facilitates sharing of expanders. Finally, the input/output transfer function of the NCO is exact, allowing a prediction of its output phase at all times after frame startup. This strict determinism is used to decouple the bias loop from the scale factor loop, in a manner described further below.

It should be noted that the NCO/up-converter circuitry may be implemented in a single LSI chip, such as the Signetics gate array SCD 249255, described in the Signetics Gate Array Specification No. 8A1260, which is capable of performing both the phase and envelope NCO functions with a dissipation of only ⅓ watt. The fabrication of a custom LSI chip offers the prospect of even greater device efficiencies.

Still referring to FIG. 7, the phase word, $\Phi_e$, from the measurement circuitry is not processed in the same way as in FIG. 4 but is used to control the bias or phase of the 825 samples taken on a given output frame, while the frequency word $\dot{\Phi}_e$, is used to control the spacing of the samples.

It will be understood that although changes in output bias and scale factor are, to a first order, independent, the first embodiment, illustrated in FIG. 4 has the property that scale factor changes will introduce small bias changes. This happens because by resetting of the output point counter 70 with each start pulse, different output scale factors will produce different absolute times of occurrence of the output center tick, tick 413.

In the second embodiment illustrated in FIGS. 5–8, the bias and scale factor loops are decoupled in the following manner. The number of ticks of the NCO clock in one half of an input frame is known, so the total NCO phase that will accumulate in this time given any measured $\dot{\Phi}_e$ is calculable and may be corrected. This is achieved as follows. The product $\dot{\Phi}_e(f_n/2)$ is formed in multiplier 106 from the $\dot{\Phi}_e$ word on line 101 and the $f_n/2$ reference, and is subtracted from the NCO envelope bias word, $\dot{\Phi}_e$, by adder 108. This produces a corrected bias word for envelope alignment. After correction by the envelope start time command EST in adder 110 to form a total bias word which also corrects for input frame start time, the greater and lesser significant bits of the total or composite bias word are passed on lines 113, 111, respectively, to correct the output point count and the A/D clock, respectively. The coarse word on line 113 is added to the output of the point counter 70, causing phase changes in units of whole sampling points. The fine bias word is used to program the start phase of the NCO 102, where it acts to modulate the phase of the A/D clock in units of less than one output point. Finally, the output point counter (OPC) is reset by the CFT start pulse, $CSP_\Delta$ described above, delayed by 825 ticks of the 82.5-MHz system reference. This provides a nominal one-frame delay from input to output.

Figure 8:
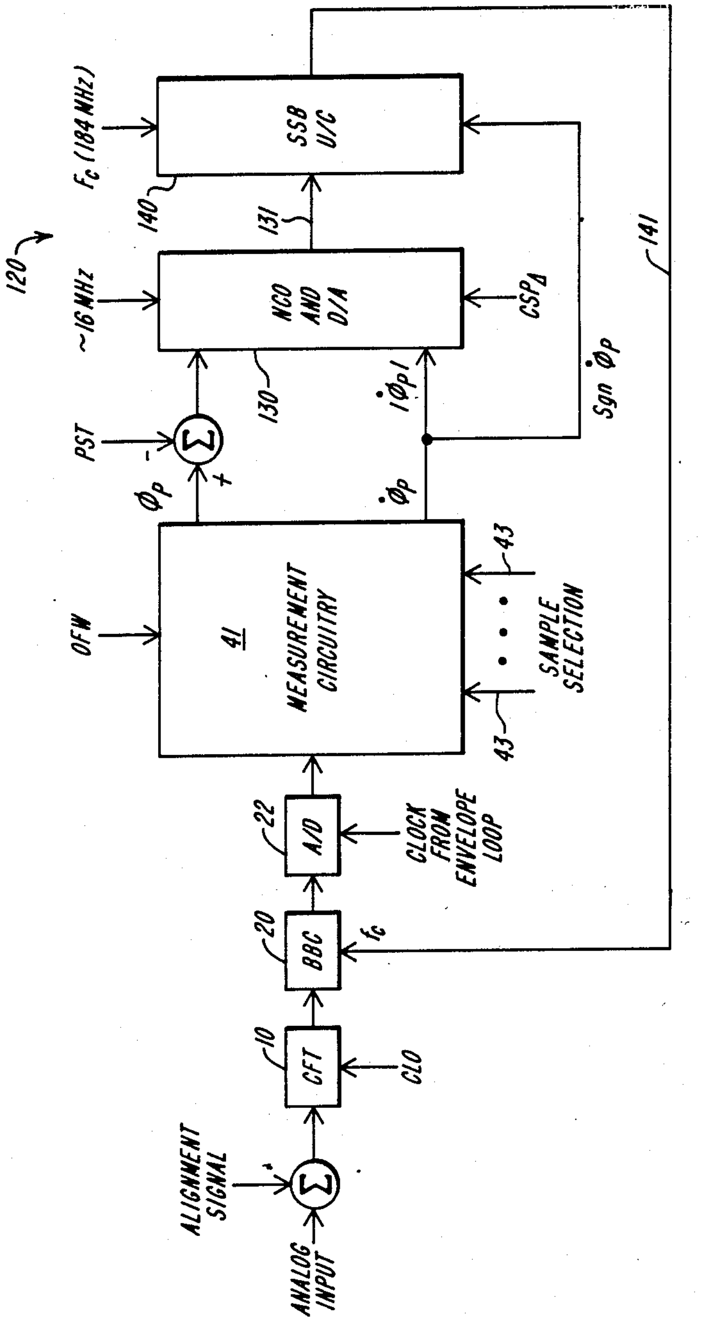

FIG. 8 shows a corresponding diagram of the phase alignment loop 120 of this second embodiment, along with CFT 10, BBC 20 and A/D converter 22. The purpose of this loop is to synthesize a BBC reference such that the BBC output is zero frequency in response to an impulse at tick 413 of the CFT frame.

This loop operates by taking measurements on the transform of an alignment signal, which Preferably is an impulse to assure there are no ambiguities in the measurements. A measurement circuit 41 operates under control of sample selection signals 43. One phase measurement from each of the alignment tones at the input band edges contains 100-kHz ambiguities in the required BBC reference frequency estimated from the measurements. This ambiguity is resolved by taking a number of samples in the vicinity of the alignment tone's output transform while the tone is stepped out from the CFT band center to its band edges during an initial acquisition mode. This is readily implemented by providing a microprocessor-based controller which selectively coordinates the injection of alignment signals by tone generator 26 (FIG. 2) with the sample selection signals provided on control lines 43 to deliver the desired measurements from the measurement module 41 for processing.

The measurement quantities required are the same as those for the envelope loop, i.e., frequency $\dot{\Phi}_p$ and phase $\Phi_p$. The frequency command is handled as in the envelope loop. The phase command is added to the PST word described above which compensates for asynchronous CFT triggering in the same manner as for the envelope loop. The corrected Phase and the frequency words control an NCO 130 to generate an output signal of the correct phase and frequency. The D/A converted NCO output passes on line 131 to a subtractive mixer 140 where it is mixed with the synthesized 184 MHz ($F_c$) and the up-converted signal is applied to the BBC reference port along line 141.

Single sideband up-conversion is employed to maintain phase integrity. Since no filters are required in the up-conversion chain, the resulting instantaneous settling of the signal to programmed phase and phase rate transients allows the NCO to be reset at each frame using the CFT expander start pulse while precisely retracing the BBC reference. This is also true of the envelope alignment NCO of FIG. 7.

This completes a description of the second illustrated embodiment of a chirp Fourier transform compensation circuit according to the invention.

A temperature-corrected chirp Fourier transformer according to the invention may be advantageously incorporated in any currently known circuit or device employing an ovenized or temperature-controlled chirp transformer. Contemplated applications of the invention include diverse circuits, such as receivers, wherein a compensated CFT as described constitutes a first stage which identifies the instantaneous frequency band or bands of a received signal. Additional circuit stages are then controlled by the first stage to generate local RF references corresponding to the identified bands for demodulating the received signal.

It will be understood that the invention has been described by reference to several embodiments thereof and illustrative circuitry in order to clearly explain its principles and operation, and that such illustration and description is not intended to limit the invention to the particular examples shown. The principles and structure of the invention being thus shown and described, variations and modifications of circuits embodying the invention will occur to those of ordinary skill in the art, and all such variations and modifications are included within the scope of the invention, as set forth in the claims appended hereto.

What is claimed is:

1. An improved chirp Fourier transformer circuit of the type wherein a broadband time varying input signal is passed through a first dispersive circuit element, is mixed with a chirp signal and is passed through a second circuit element to produce an output signal representative of the frequency domain transform of said input signal, said output signal being sampled at a plurality of sampling intervals to determine successive frequency band components of said input signal, wherein the improvement comprises alignment tone means for injecting known tones into said first dispersive circuit element thereby developing transformed output alignment signals corresponding thereto, measurement means for measuring said output alignment signals to develop measurements thereof, and output correction means responsive to said measurements for shifting said sampling intervals such that a defined sampling interval corresponds to a fixed input tone, thereby correcting output signal drift.

2. The improved transformer circuit of claim 1, wherein said output correction means includes means for developing a sampling clock signal having a period proportional to a change in scale of said output signal.

3. The transformer circuit of claim 1, wherein said output signal is a modulated RF signal, and wherein the transformer circuit comprises means for generating a phase-corrected reference RF signal for converting the output signal to a baseband.

4. The transformer circuit of claim 2, wherein said output signal is a modulated RF signal, and wherein the transformer circuit comprises means for generating a phase-corrected reference RF signal for converting the output signal to a baseband.

5. The transformer circuit of claim 2, wherein said tones correspond to endpoints of the input bandwidth processed by said transformer circuit.

6. The transformer circuit of claim 2, wherein said alignment tones are continuous wave tones selected to lie in a frequency range disjoint from an information-bearing input signal frequency.

7. The transformer circuit of claim 2, wherein said alignment tone means includes first alignment means for injecting a short duration alignment tone to determine a corresponding coarse transformed output signal lying in a plurality of sampling intervals, and second alignment means for injecting a continuous wave alignment tone to determine a corresponding narrow transformed output signal lying substantially in a single sampling interval, and wherein said output correction means responds to measurements of said coarse transformed output signal to effect coarse alignment of said sampling intervals and responds to said narrow transformed output signal effect fine alignment of said sampling intervals.

8. The transformer circuit of claim 1, wherein said output correction means includes means for shifting a clock signal to determine a plurality of sampling intervals successively offset by a scale factor proportional to the spacing of said output alignment signals.

9. The transformer circuit of claim 1, wherein said output signal is converted to baseband by mixing with a baseband conversion signal having a nominal center frequency of said second circuit element, and wherein said output correction means further includes phase alignment means responsive to measurements of said output alignment signals for adjusting the phase of said baseband conversion signal so as to compensate for phase delays in said circuit elements.

10. The transformer circuit of claim 1, further comprising means for coordinating said alignment tone means and said measurement means to provide a stepped sequence of alignment tones at the transformer input while measuring the transformer output.

11. The transformer circuit of claim 1, further comprising a second dispersive circuit element having characteristics substantially identical to said first dispersive circuit element, and means for mixing said chirp signal with a delayed signal from said second dispersive circuit element to produce a baseband conversion signal for conversion of the output signal.

12. A method of temperature compensating a chirp Fourier transforming circuit of the type wherein an input signal to be transformed is propagated through a surface acoustic wave device having a temperature dependent frequency dispersive characteristic, and the dispersed input signal is passed through further circuit elements to develop an output signal with a spectrum corresponding to the frequency domain Fourier transform of said input signal, such method comprising the steps of providing known alignment tones as an input to said surface acoustic wave device to develop corresponding spectrally separated transformed output alignment signals, determining the spacing of said transformed output alignment signals, and aligning a plurality of output sampling intervals with respect to said output alignment signals such that a given input frequency is transformed to a fixed output sampling interval independent of temperature variation of said surface acoustic wave device.

13. The method of claim 12, wherein said step of aligning comprises the steps of aligning first and second sampling intervals about respective first and second transformed output alignment signals, and defining a fixed plurality of equispaced sampling intervals between said first and second sampling intervals, such that output signals in a given sampling interval correspond to the transform of a fixed range of frequencies of the input signal.

14. The method of claim 13, wherein said output signals are converted to baseband by mixing with a baseband conversion signal, said sampling intervals being defined on the baseband-converted output signals, and further including the step of adjusting the phase of the baseband conversion signal in response to measurements of the transformed output alignment signals so as to correct delays in said output signal.

15. The method of claim 12, further comprising the step of providing a delayed signal from a second surface acoustic wave device having a characteristic identical to said surface acoustic wave device and forming a baseband conversion reference signal from the delayed signal for demodulating the output signal.

16. A method of temperature compensating a chirp Fourier transforming circuit of the type wherein an input signal to be transformed is propagated through a surface acoustic wave device having a temperature dependent frequency dispersive characteristic, and the dispersed input signal is passed through further circuit elements to develop an output signal with a spectrum corresponding to the frequency domain Fourier transform of said input signal, such method comprising the steps of providing known alignment tones as an input to said surface acoustic wave device to develop corresponding spectrally separated transformed output alignment signals, digitizing the output signal in a fixed plurality of sampling intervals defined by a sampling clock, and controlling the rate of the sampling clock in accordance with said digitized values to shift the sampling intervals such that each sampling interval corresponds to a fixed frequency band of the input signal.

17. The method of claim 16, wherein said step of controlling includes varying the position and duration of the sampling intervals defined by the clock.

18. The method of claim 16, wherein the step of controlling includes maintaining a sampling interval centered about a transformed output alignment signal.

* * * * *